(12) United States Patent
Lee (10) Patent No.: US 12,494,464 B2
(45) Date of Patent: Dec. 9, 2025

(54) SPHERICAL DISPLAY DEVICE HAVING THROUGH HOLES BETWEEN PIXEL STRUCTURES OF A PLURALITY OF DISPLAY UNITS

(71) Applicant: AUO Corporation, Hsin-Chu (TW)

(72) Inventor: Chih-Tsung Lee, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 436 days.

(21) Appl. No.: 18/089,058

(22) Filed: Dec. 27, 2022

(65) Prior Publication Data

US 2023/0299063 A1    Sep. 21, 2023

(30) Foreign Application Priority Data

Mar. 18, 2022    (TW) .................................. 111110218

(51) Int. Cl.
| | |
|---|---|
| *H01L 25/16* | (2023.01) |
| *H10K 59/12* | (2023.01) |
| *H10K 59/80* | (2023.01) |
| *H10K 59/60* | (2023.01) |

(52) U.S. Cl.
CPC ........... *H01L 25/167* (2013.01); *H10K 59/12* (2023.02); *H10K 59/873* (2023.02); *H10K 59/60* (2023.02)

(58) Field of Classification Search
CPC ..... H01L 25/167; H10K 59/873; H10K 59/12
See application file for complete search history.

(56) References Cited

U.S. PATENT DOCUMENTS

| | | | |
|---|---|---|---|
| 9,063,351 B1* | 6/2015 | Ho | ........................... A61B 3/18 |
| 10,359,648 B2 | 7/2019 | Kim et al. | |
| 11,402,662 B2 | 8/2022 | Wyss et al. | |
| 2006/0227067 A1 | 10/2006 | Iwasaki | |
| 2014/0371560 A1* | 12/2014 | Etzkorn | ................. A61B 5/682 |
| | | | 427/2.12 |
| 2017/0219825 A1 | 8/2017 | Benoit et al. | |
| 2021/0263336 A1 | 8/2021 | Gupta et al. | |
| 2021/0311326 A1* | 10/2021 | Wyss | ....................... G02C 7/04 |
| 2022/0093579 A1* | 3/2022 | Kishimoto | ........... H10H 20/018 |

(Continued)

FOREIGN PATENT DOCUMENTS

| | | |
|---|---|---|
| CN | 105467615 A | 4/2016 |
| CN | 106707510 A | 5/2017 |
| CN | 106707547 A | 5/2017 |

(Continued)

OTHER PUBLICATIONS

Office Action issued by the State Intellectual Property Office of the Peoples Republic of China on May 31, 2023 for Application No. 202211012956.4, China.

(Continued)

*Primary Examiner* — Michael Jung
(74) *Attorney, Agent, or Firm* — Tim Tingkang Xia, Esq.; Troutman Pepper Locke LLP (57) ABSTRACT

A spherical display device includes an arc substrate and a plurality of display units. The arc substrate has a convex surface and a concave surface opposite to the convex surface. The plurality of display units is disposed on the concave surface of the arc substrate, and a perpendicular distance from the display unit to a central axis of the arc substrate ranges between 1.345 mm and 4.3 mm.

20 Claims, 10 Drawing Sheets

(56) References Cited

U.S. PATENT DOCUMENTS

| | | | | |
|---|---|---|---|---|
| 2022/0269109 A1* | 8/2022 | Lee | ................... | G02C 7/04 |
| 2022/0309973 A1* | 9/2022 | Won | ................... | G09G 3/035 |

FOREIGN PATENT DOCUMENTS

| | | | |
|---|---|---|---|
| CN | 110673386 | A | 1/2020 |
| CN | 110955063 | A | 4/2020 |
| CN | 113035914 | A | 6/2021 |
| CN | 113504650 | A | 10/2021 |
| TW | 202032210 | A | 9/2020 |

OTHER PUBLICATIONS

Office Action issued by the Taiwan Intellectual Property Office Ministry of Economic Affairs, R.O.C. on Jun. 6, 2023 for Application No. 111110218, Taiwan.

* cited by examiner

SPHERICAL DISPLAY DEVICE HAVING THROUGH HOLES BETWEEN PIXEL STRUCTURES OF A PLURALITY OF DISPLAY UNITS

CROSS-REFERENCE TO RELATED PATENT APPLICATION

This non-provisional application claims priority to and the benefit of, pursuant to 35 U.S.C. § 119 (a), patent application No. 111110218 filed in Taiwan on Mar. 18, 2022. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a display device, and particularly to a spherical display device.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the maturing of the display technology, near-to-eye display products such as the head-up display, Google Glass, etc. provide various choices and experiences for the consumers. Since the weight and thickness of the display are very light and thin, the contact lens products integrating the display have been developed.

However, in the current contact lens integrating the display, the display is mostly disposed in the central fixation zone of the contact lens, thus affecting the reception of ambient light in the main visual area of the user. Further, directly integrating the display in the contact lens may affect the air permeability of the contact lens, causing the contact lens not being able to be worn for a long period of time.

SUMMARY

The present disclosure provides a spherical display device, which may prevent from affecting the reception of ambient light in the main visual area of the eye.

The present disclosure provides a spherical display device, which may provide good air and moisture permeability.

One embodiment of the present disclosure provides a spherical display device, which includes: an arc substrate, having a convex surface and a concave surface opposite to each other; and a plurality of display units, located on the concave surface of the arc substrate; wherein a perpendicular distance from the display units to a central axis of the arc substrate ranges between 1.345 mm and 4.3 mm.

In one embodiment of the present disclosure, the perpendicular distance from the display units to the central axis of the arc substrate ranges between 1.345 mm and 3.29 mm.

In one embodiment of the present disclosure, when matching with an eye of a user, in a direction perpendicular to the spherical display device, some of the display units overlap with a pupil of the eye.

In one embodiment of the present disclosure, the spherical display device has a central area and a display area surrounding the central area, the display units are located in the display area and do not exist in the central area, and when matching with an eye of a user, a viewing angle of the display area is between 9 and 30 degrees.

In one embodiment of the present disclosure, the arc substrate comprises a plurality of film layers, and the film layers comprise silicon oxide layers and silicon nitride layers alternately stacked.

In one embodiment of the present disclosure, the display units are physically separated.

In one embodiment of the present disclosure, the display units comprise a plurality of pixel structures, and through holes are disposed between the pixel structures.

In one embodiment of the present disclosure, each of the display units comprises a driving circuit layer and a plurality of light emitting components, the driving circuit layer is located between the light emitting components and the arc substrate, and the light emitting components are electrically connected to the driving circuit layer.

In one embodiment of the present disclosure, each of the display units further comprises a lens layer, and the light emitting components are located between the lens layer and the driving circuit layer.

In one embodiment of the present disclosure, each of the display units further comprises a polarizing layer, located between the lens layer and the light emitting components.

In one embodiment of the present disclosure, the spherical display device further comprises a light redirecting component, located on the concave surface of the arc substrate.

In one embodiment of the present disclosure, the spherical display device further comprises a photoelectric component, located on the convex surface of the arc substrate.

In one embodiment of the present disclosure, the photoelectric component comprises a reflective display component, a light detector or a photovoltaic component.

In one embodiment of the present disclosure, the spherical display device further comprises a protective layer covering the display units.

In one embodiment of the present disclosure, the spherical display device comprises an outer cover layer wrapping the arc substrate and the display units.

In one embodiment of the present disclosure, the outer cover layer comprises an outer layer, and the outer layer comprises a high moisture and high oxygen permeability material.

In one embodiment of the present disclosure, the outer cover layer further comprises an inner layer, the inner layer is located between the outer layer and the arc substrate, and the inner layer comprises a hard or soft base material.

One embodiment of the present disclosure provides a spherical display device, which includes: an arc substrate, having a convex surface and a concave surface opposite to each other; a plurality of display units, located on the concave surface of the arc substrate, wherein the display units are physically separated, and each of the display units has a plurality of through holes; and an outer cover layer, wrapping the arc substrate and the display units.

In one embodiment of the present disclosure, a perpendicular distance from the display units to a central axis of the arc substrate ranges between 1.345 mm and 4.3 mm.

In one embodiment of the present disclosure, when matching with an eye of a user, a viewing angle of the display units is between 9 and 30 degrees.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

In the accompanying drawings, to clearly show the components, the thicknesses of the layers, films, panels and areas, etc. are enlarged. In the disclosure, identical drawing references indicates identical components. It should be understood that components such as the layers, films, panels and areas, etc., are referred to as being "on" or "connected to" another component, they may be on or connected to another component directly, or an intermediate component may exist therebetween. To the contrary, when a component is referred to as being "directly on" or "directly connected to" another component, there is no intermediate component therebetween. As used herein, being "connected" may refer to physical connection or electrical connection. Further, being "electrically connected" or "coupled" refers to the case where other components may exists between the two components.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terms "about", "approximately" or "substantially" as used herein shall cover the values and value ranges described, and cover an acceptable deviation range of the specific values ascertained by one of ordinary skill in the art, where the deviation range may be determined by specific quantities of errors related to the measurement, and the errors are determined by the limitations of the measuring system or the manufacturing process conditions. In addition, the term "about" represents within one or more standard deviations of a given value of range, such as within ±30 percent, within ±20 percent, within ±10 percent or within ±5 percent. Moreover, the terms "about", "approximately" or "substantially" as used herein may selectively refer to a more acceptable deviation range or the standard deviation based on the optical characteristics, the etching characteristic or other characteristics, without applying one standard deviation to all characteristics.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the contents described below, sectional schematic views are referred to as preferred embodiments for describing the exemplary embodiments. Thus, deviations of the shapes serving as a result of manufacturing techniques and/or tolerances may be expected. Thus, the description of the embodiments is not limited to the specific shapes of the areas as described, and should include, for example, deviations of the shapes as a result of manufacturing. For example, a flat surface illustrated or described may generally have rough and/or non-linear features, and an acute angle shown in the figures may be round. Therefore, the areas as shown in the figures are essentially schematic, and shapes thereof are not intended to show the accurate shapes of the areas, and are not intended to limit the scope of the claims of the present disclosure.

Figure 1A:
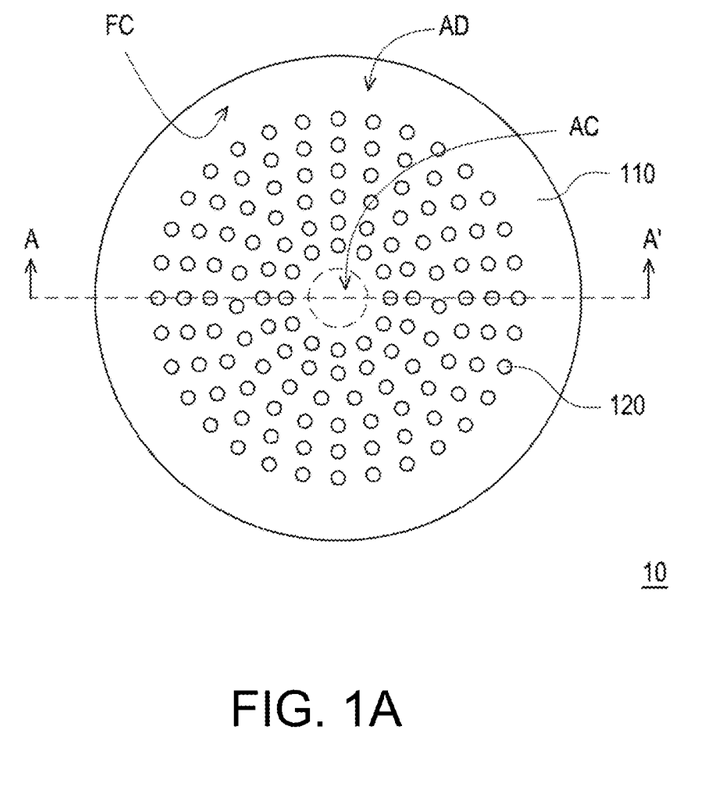
FIG. 1A is a rear schematic view of a spherical display device 10 according to one embodiment of the present disclosure.
Figure 1B:
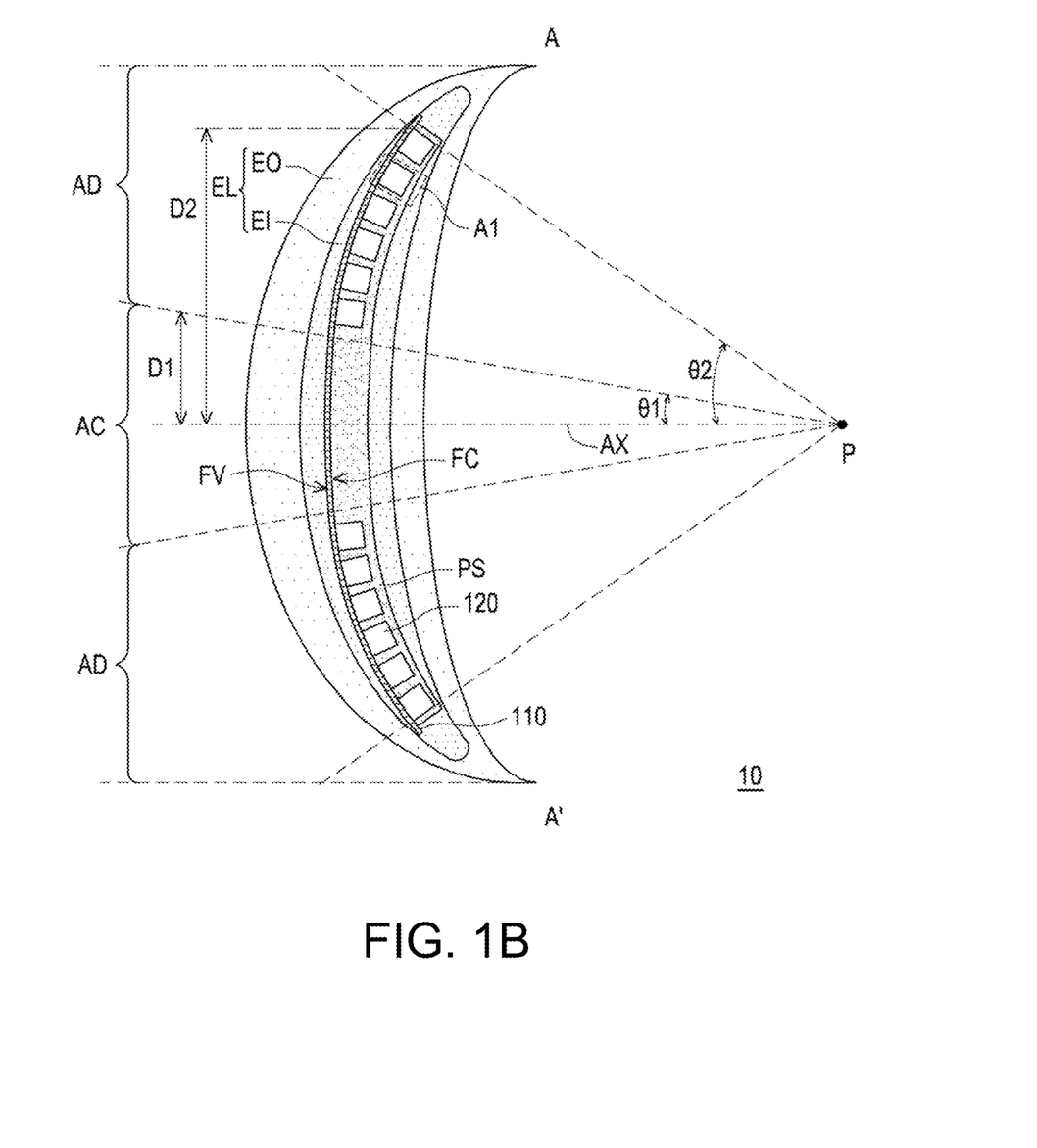
FIG. 1B is a sectional schematic view along a sectional line A-A' of FIG. 1A.
Figure 1C:
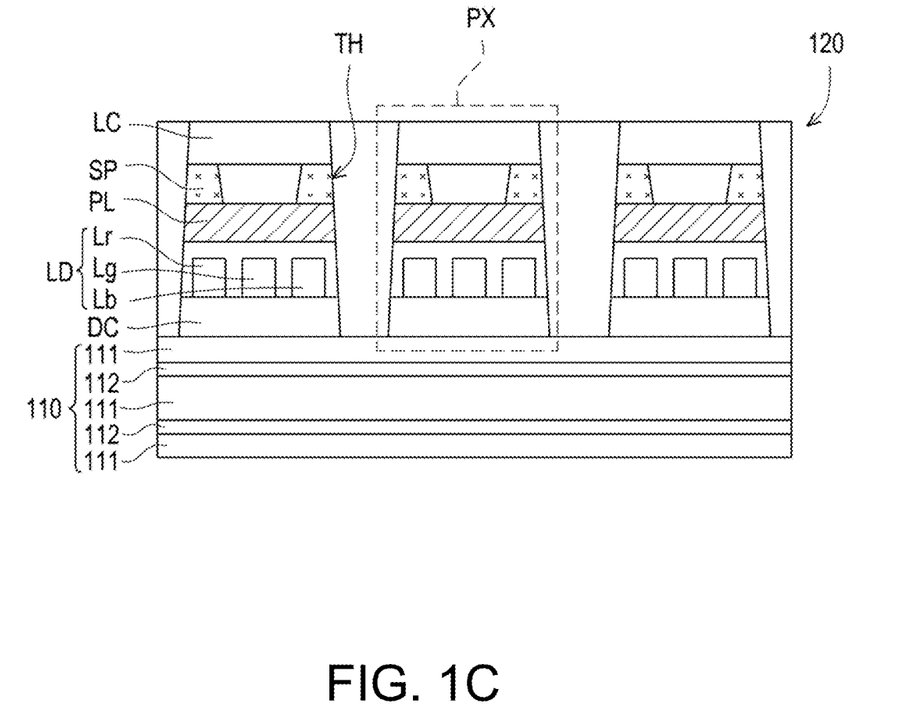
FIG. 1C is an enlarged schematic view of an area A1 of FIG. 1B.
Figure 1D:
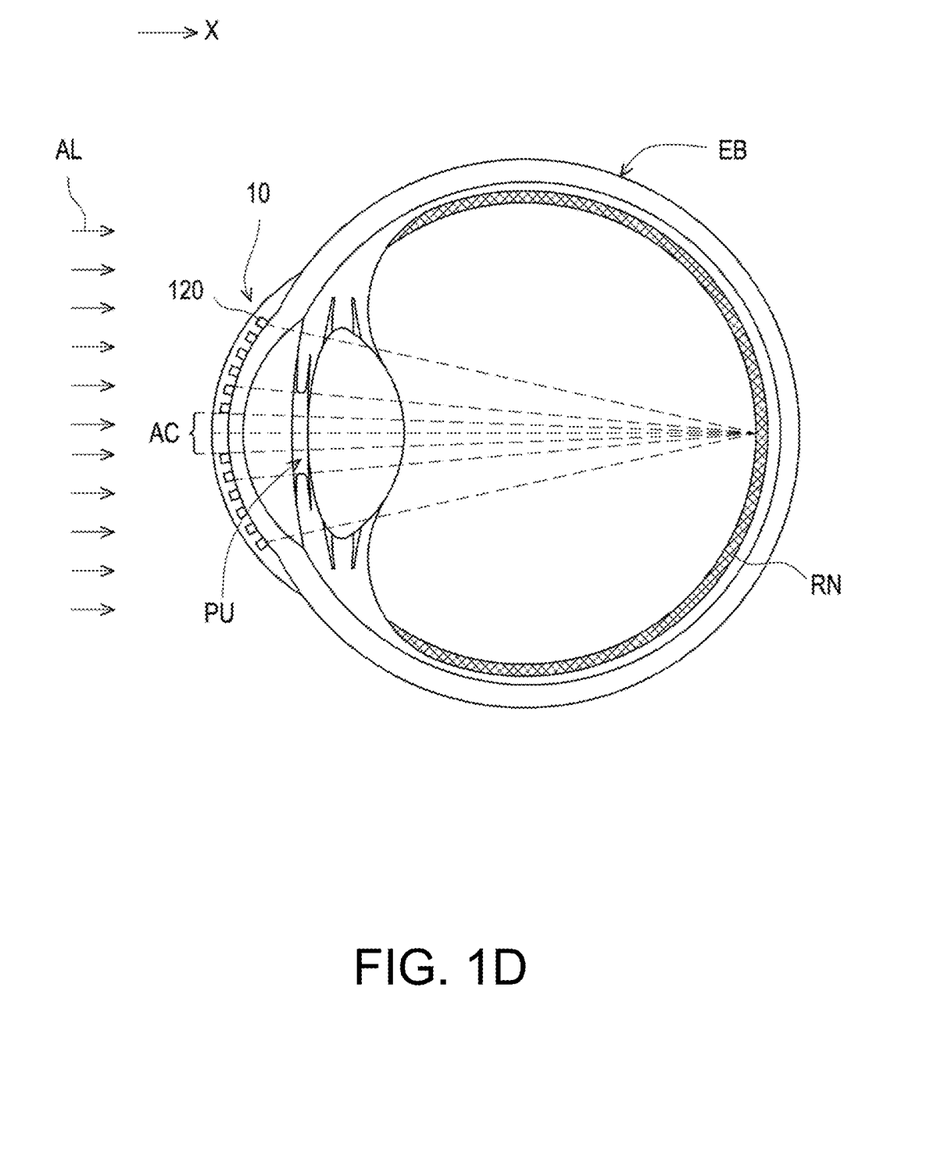
FIG. 1D is a schematic view of a spherical display device 10 according to one embodiment of the present disclosure matching with an eye of a user.

FIG. 1A is a rear schematic view of a spherical display device 10 according to one embodiment of the present disclosure. FIG. 1B is a sectional schematic view along a sectional line A-A' of FIG. 1A. FIG. 1C is an enlarged schematic view of an area A1 of FIG. 1B. FIG. 1D is a schematic view of a spherical display device 10 according to one embodiment of the present disclosure matching with an eye of a user. For concise description of the figures, FIG. 1A schematically illustrates the arc substrate 110 and the display units 120, and other structures are omitted.

Referring to FIG. 1A to FIG. 1D, the spherical display device 10 includes: an arc substrate 110, having a convex surface FV and a concave surface FC opposite to each other; and a plurality of display units 120, located on the concave surface FC of the arc substrate 110. A perpendicular distance D2 from the display units 120 to a central axis AX of the arc substrate 110 ranges between 1.345 mm and 4.3 mm.

In the spherical display device 10 according to one embodiment of the present disclosure, by disposing the display units 120 to have a perpendicular distance D2 to the central axis AX of the arc substrate 110 in the range between 1.345 mm and 4.3 mm, affecting the reception of ambient light in the main visual area of the eye with a perpendicular distance D1 being less than 1.345 mm may be prevented.

The embodiments of the components of the spherical display device 10 are hereinafter described with reference to FIG. 1A to FIG. 1D, without limiting the present disclosure thereto.

Firstly, referring to FIG. 1C, the arc substrate 110 of the spherical display device 10 may be a soft substrate, and the arc substrate 110 may be a transparent substrate or an opaque substrate, the material thereof may include silicon oxide (SiOx), silicon nitride (SiNx), silicon oxynitride (SiNxOy), polyimide (PI), polycarbonate (PC), polyester (PET) or cyclic olefin copolymer (COC), without being limited thereto. The arc substrate 110 may include a plurality of film layers, such as a plurality of insulating layers. For example, in the present embodiment, the arc substrate 110 may include insulating layers 111 and insulating layers 112 alternately stacked. The insulating layers 111 and the insulating layers 112 may have different stress, thicknesses, areas, Young's moduli and/or heat expansion coefficients, such that the arc substrate 110 has the arc contour. In certain embodiments, the insulating layers 111 may be silicon oxide (SiOx) layers, and the insulating layers 112 may be silicon nitride (SiNx) layers, without being limited thereto. In certain embodiments, the arc substrate 110 may include three or more different film layers alternately stacked.

Referring to FIG. 1B, the fovea of the human eye is the most visual sensitive area thereof, and a line connecting the center of curvature of the cornea and the fovea is the visual axis of the human eye. In the present embodiment, the point P serves as the fovea, and the central axis AX of the spherical display device 10 passes the point P. Thus, the central axis AX of the spherical display device 10 serves as the visual axis of the human eye, and an included angle between the light and the central axis AX is the viewing angle.

Referring to both FIG. 1A and FIG. 1B, in the present embodiment, the spherical display device 10 may have a central area AC and a display area AD, and the most visual sensitive main visual area of the human eye corresponds to the central area AC of the spherical display device 10. Generally, the central area AC of the spherical display device 10 may include the area at two sides of the central axis AX with the viewing angle θ1 being less than about 9 degrees. In other words, the range of the viewing angle of the central area AC is twice the viewing angle θ1, that is, the range of the viewing angle of the central area AC is about 18 degrees, without being limited thereto.

For example, the radius of curvature of the cornea of the human eye ranges between about 7.4 to 8.3 mm, and the spherical display device 10 may be adhered at an outer side of the cornea. Thus, the radius of curvature of the spherical display device 10 may range between 8.3 to 8.9 mm. A section of the spherical display device 10 located in the central area AC may have a perpendicular distance D1 to the central axis AX, and when the radius of curvature of the spherical display device 10 is about 8.6 mm and the viewing angle θ1 is 9 degrees, the perpendicular distance D1 is about 1.345 mm. Thus, the area on the spherical display device 10 having the perpendicular distance D1 being less than 1.345 mm to the central axis AX belongs to the central area AC. In the present embodiment, no display units 120 exist in the central area AC.

In the present embodiment, the display units 120 are disposed only in the display area AD of the spherical display device. The display area AD surrounds the central area AC, and a central axis of the display area AD overlaps with the central axis AX. The display area AD of the spherical display device 10 may include the area at the two sides of the central axis AX with a viewing angle θ2 ranging between about 9 to 30 degrees, without being limited thereto. In certain embodiments, the viewing angle θ2 may range between 9 to 22.5 degrees.

In the present embodiment, when the radius of curvature of the spherical display device 10 is about 8.6 mm and the viewing angle θ2 may range between 9 to 30 degrees, a perpendicular distance D2 from the display units 120 located in the display area AD to the central axis AX may range between 1.345 mm to 4.3 mm. In certain embodiments, when the radius of curvature of the spherical display device 10 is about 8.6 mm and the viewing angle θ2 may range between 9 to 22.5 degrees, a perpendicular distance D2 from the display units 120 located in the display area AD to the central axis AX may range between 1.345 mm to 3.29 mm.

In the present embodiment, the display units 120 may be arranged on the concave surface FC of the arc substrate 110 in the form of concentric circles, without being limited thereto. In other embodiments, the display units 120 may be arranged on the concave surface FC of the arc substrate 110 in an array or other forms.

Referring to FIG. 1B and FIG. 1C, in certain embodiments, the display units 120 may be physically separated and electrically connected, without being limited thereto. In certain embodiments, the display units 120 may be physically separated and electrically separated. Since the display units 120 are physically separated, the spherical display device 10 may have good stretchability.

In certain embodiments, each display unit 120 may include a plurality of pixel structures PX, and each display unit 120 may have a plurality of through holes TH. The through holes TH may be disposed between the pixel structures PX, thus enhancing the air and moisture permeability of the spherical display device 10.

In certain embodiments, each pixel structure PX of the display units 120 may respectively include a driving circuit layer DC and a plurality of light emitting components LD. The driving circuit layer DC may be located between the light emitting components LD and the arc substrate 110, and the light emitting components LD may be electrically connected to the driving circuit layer DC respectively. The driving circuit layer DC may include the components or lines required by the spherical display device 10, such as driving components, switch components, storage capacitances, signal lines, etc. For example, the thin film deposition process, the lithography process and the etching process may be used to form the driving circuit layer DC.

The light emitting components LD may be self-illuminating components, such as micro light emitting diodes (micro-LEDs) or organic light emitting diodes (OLEDs). In the present embodiment, the light emitting components LD may include light emitting components Lr, Lg, Lb, and the light emitting components Lr, Lg, Lb may be all blue LEDs. That is, the light emitting components Lr, Lg, Lb all emit blue light, without being limited thereto. To provide full color display effect, color conversion layers may be further disposed on the light emitting components Lr, Lg respectively, in order to convert the blue light emitted by the light emitting component Lr to red light, and to convert the blue light emitted by the light emitting component Lg to green light, such that the light emitting components Lr, Lg, Lb constitute a pixel of the spherical display device 10, and each display unit 120 may include one or more pixels based on the need. In certain embodiments, the light emitting components Lr, Lg, Lb may not all be blue LEDs. For example, in certain embodiments, the light emitting components Lr, Lb may be both blue LEDs, and the light emitting component Lg may be a blue LED. In this case, the color conversion layer may be disposed only on the light emitting component Lr, without disposing the color conversion layer on the light emitting component Lg.

In certain embodiments, each pixel structure PX of the display units 120 may further include a lens layer LC, and the light emitting components LD may be located between the lens layer LC and the driving circuit layer DC. The lens layer LC may be, for example, a liquid crystal lens, thus changing the image projection location of the display units 120.

In certain embodiments, each pixel structure PX of the display units 120 may further include a polarizing layer PL, and the polarizing layer PL is located between the lens layer LC and the light emitting components LD. The polarizing layer PL may be a wire grid polarizing film or a photonic crystal multilayer film, without being limited thereto. In certain embodiments, each pixel structure PX may further include a separation object SP, and the separation object may be located between the lens layer LC and the polarizing layer PL.

Referring to FIG. 1B, in certain embodiments, the spherical display device 10 may further include a protective layer PS, and the protective layer PS may cover the display units 120. The material of the protective layer PS may include an elastic material, such as thermoplastic polyurethane or thermoplastic polyolefin elastomer, in order not to affect the stretchability of the spherical display device 10.

In certain embodiments, the spherical display device 10 may further include an outer cover layer EL, and the outer cover layer EL may completely wrap the arc substrate 110, the display units 120 and the protective layer PS. In certain embodiments, the outer cover layer EL may include an inner layer EI and an outer layer EO, where the inner layer EI may be located between the outer layer EO and the arc substrate 110. The outer layer EO may include a high moisture and high oxygen permeability material, such as the high moisture and high oxygen permeability material generally used by the contact lens. The inner layer EI may include a hydrophobic material, thus protecting the components of the spherical display device 10. In certain embodiments, the material of the inner layer EI may include a soft base material, and the inner layer EI may be formed by coating or forming, without being limited thereto. In certain embodiments, the material of the inner layer EI may include a hard base material, such that the inner layer EI may be partially drilled with holes, in order to adhere the components on the surface of the inner layer EI.

Referring to FIG. 1D, when the spherical display device 10 matches with an eye EB of a user, in a direction X perpendicular to the spherical display device 10, some of the display units 120 overlap with a pupil PU of the eye EB, and the central area AC is mainly used to receive ambient light AL. Thus, the main visual area of the eye EB is mainly used to receive the ambient image, and the display units 120 may project the virtual image directly to the retina RN. In certain embodiments, the spherical display device 10 may match with a single eye and project a complete virtual image, thus providing the single-eye virtual reality (VR) display effect. In certain embodiments, the spherical display device 10 may match with the non-dominant eye, and the image provided by the spherical display device 10 may be combined with the ambient image received by the dominant eye to form augmented reality (AR) or mixed reality (MR) images.

The other embodiments of the present disclosure are hereinafter described with reference to FIG. 2 to FIG. 7, and the reference numbers and related contents of the embodiments in FIG. 1A to FIG. 1D are used, where identical drawing references indicates identical or similar components, and descriptions of identical technical features are omitted. The descriptions omitted may be referred to in the embodiments in FIG. 1A to FIG. 1D, and are thus not further hereinafter elaborated.

Figure 2:
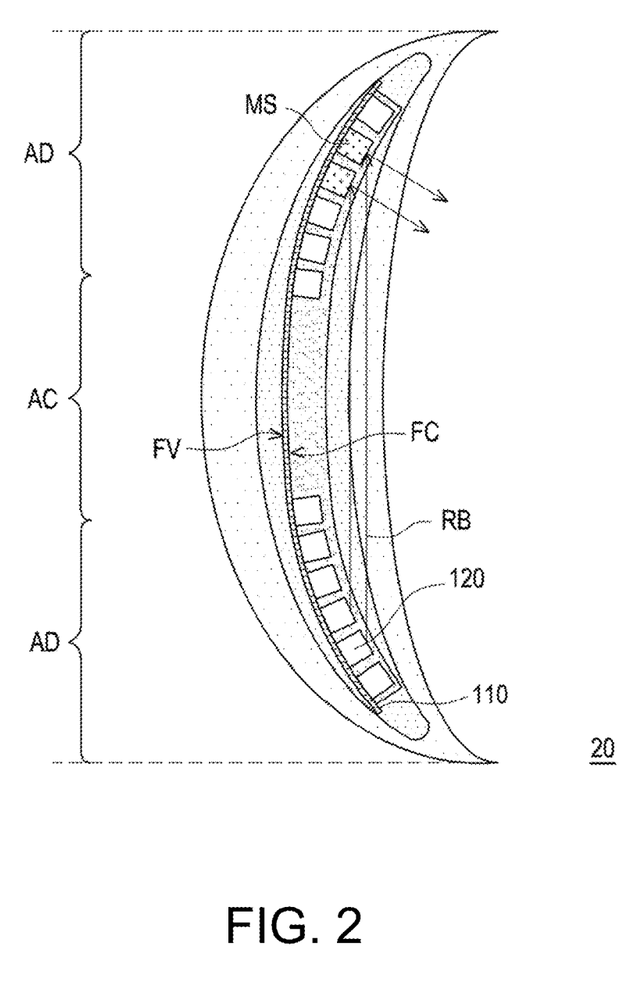
FIG. 2 is a sectional schematic view of a spherical display device 20 according to one embodiment of the present disclosure.

FIG. 2 is a sectional schematic view of a spherical display device 20 according to one embodiment of the present disclosure. The spherical display device 20 includes: an arc substrate 110, having a convex surface FV and a concave surface FC opposite to each other, and has a central area AC and a display area AD surrounding the central area AC; and a plurality of display units 120, located on the concave surface FC of the arc substrate 110 and only in the display area AD.

Compared to the spherical display device 10 as shown in FIG. 1A to FIG. 1B, the differences of the spherical display device 20 as shown in FIG. 2 exist in that: the spherical display device 20 may further include a plurality of light redirecting components MS, where the light redirecting components MS may be located on the concave surface FC of the arc substrate 110, and the light redirecting components MS may be located in the display area AD. In certain embodiments, the light redirecting components MS may be located between the display units 120. The light redirecting components MS may redirect the light from the display units 120. For example, when the spherical display device 20 matches with the eye of the user, the light redirecting components MS may reflect the light beams RB from the display units 120 toward the retina or the fovea. In certain embodiments, the light redirecting components MS may be microelectromechanical systems (MEMS) components, without being limited thereto.

Figure 3A:
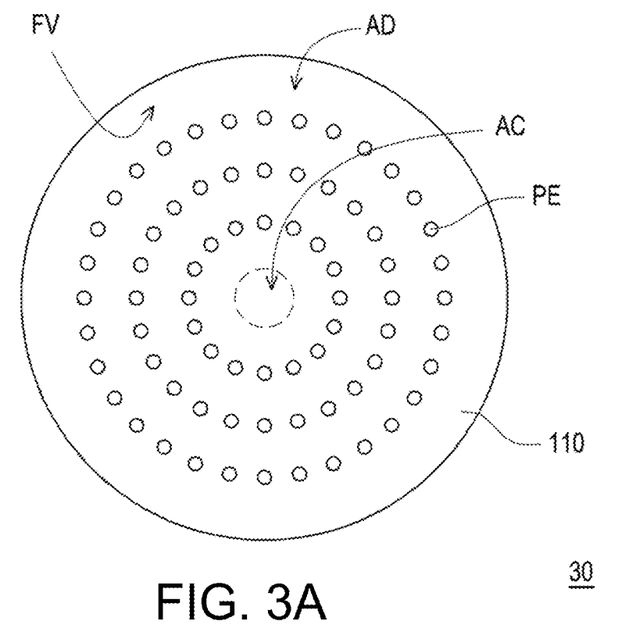
FIG. 3A is a front schematic view of a spherical display device 30 according to one embodiment of the present disclosure.

FIG. 3A is a front schematic view of a spherical display device 30 according to one embodiment of the present disclosure. The arc substrate of the spherical display device 30 has a central area AC and a display area AD surrounding the central area AC, and the arc substrate 110 has a convex surface FV. Compared to the spherical display device 10 as shown in FIG. 1A to FIG. 1B, the differences of the spherical display device 30 as shown in FIG. 3A exist in that: the spherical display device 30 may further includes a photoelectric component PE, and the photoelectric component PE may be located on the convex surface FV of the arc substrate 110.

In the present embodiment, the photoelectric component PE may be located in the display area AD in order not to affect the reception of the ambient light by the main visual area of the eye. In certain embodiments, the photoelectric component PE may be arranged on the convex surface FV of the arc substrate 110 in the form of concentric circles, but the arrangement of the photoelectric component PE is not limited thereto.

In certain embodiments, the photoelectric component PE may be a reflective display component. Thus, when the spherical display device 30 matches with an eye of a user, the photoelectric component PE may serve as, for example, an iris display.

Figure 3B:
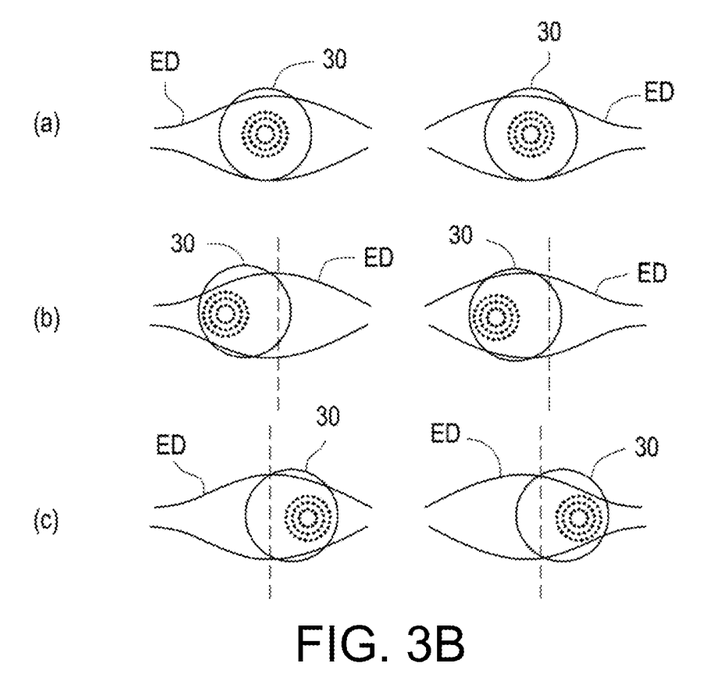
FIG. 3B is a schematic view of the spherical display device 30 of FIG. 3A matching with eyes of a user.

In certain embodiments, the photoelectric component PE may be a light detector, and when the spherical display device 30 matches with both eyes of a user, the light detector may, for example, detect the ambient light brightness, thus adjusting the focusing location of the spherical display device 30. Alternatively, in certain embodiments, the light detector may provide optical positioning, thus adjusting the location of the spherical display device 30 related to the eye. As shown in FIG. 3B, FIG. 3B is a schematic view of the spherical display device 30 of FIG. 3A matching with eyes of a user. In figure (a) of FIG. 3B, the spherical display device 30 may be located right in front of the eyes of the user, and the position of the spherical display device 30 may substantially correspond to a middle section of the eyelids ED of the eyes. In figure (b) of FIG. 3B, the spherical display device 30 may be adjusted to be located toward a left side of the eyes of the user. Thus, the position of the spherical display device 30 may substantially correspond to a left half section of the eyelids ED. In figure (c) of FIG. 3B, the spherical display device 30 may be adjusted to be located toward a right side of the eyes of the user. Thus, the position of the spherical display device 30 may substantially correspond to a right half section of the eyelids ED.

In certain embodiments, the photoelectric component PE may be a photovoltaic component. Thus, the photoelectric component PE may provide power source required for the spherical display device 30.

Figure 4:
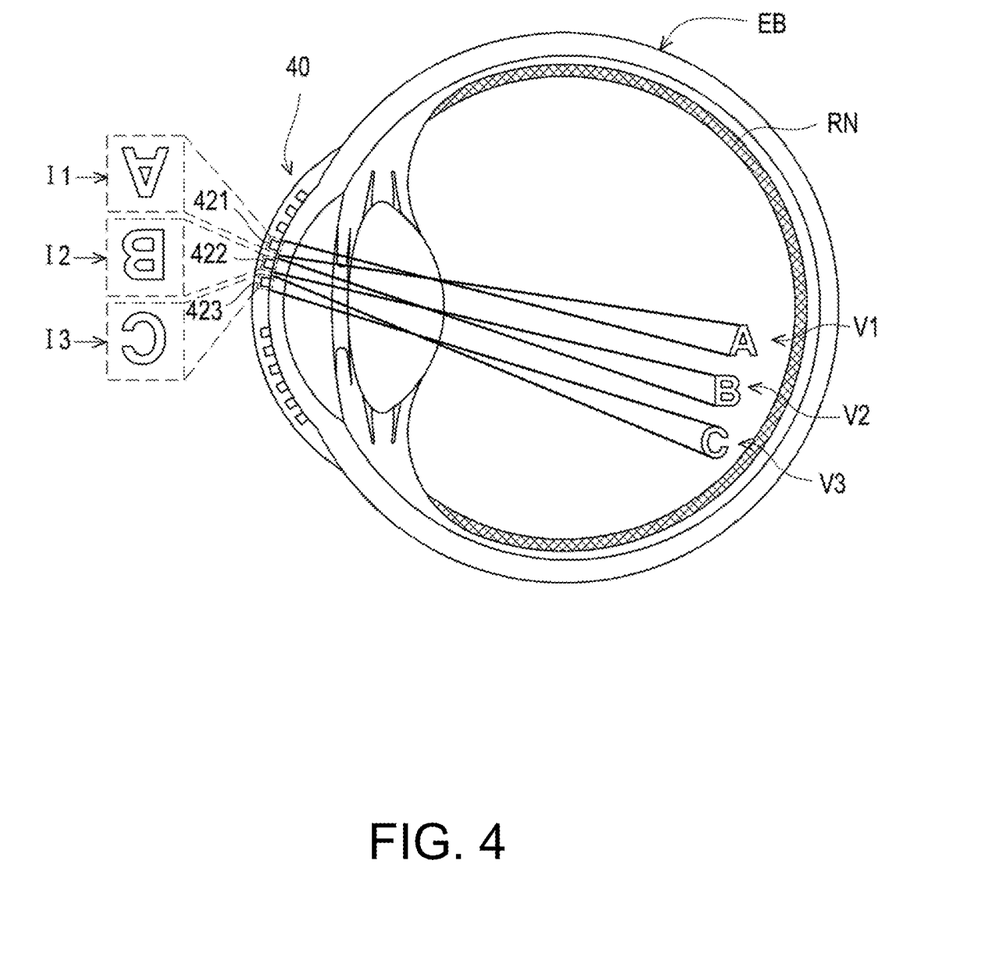
FIG. 4 is a schematic view of a spherical display device 40 according to one embodiment of the present disclosure matching with an eye of a user.

FIG. 4 is a schematic view of a spherical display device 40 according to one embodiment of the present disclosure matching with an eye of a user. Compared to the spherical display device 10 as shown in FIG. 1A to FIG. 1B, the differences of the spherical display device 40 as shown in FIG. 4 exist in that: the spherical display device 40 may include a plurality of display units 421, 422, 423, and each pixel structure of the display units 421, 422, 423 may further include the aforementioned lens layer LC, such that the display units 421, 422, 423 may focus and project the image onto specific locations on the retina RN by the aforementioned lens layer LC. For example, the pixel structures of the display unit 421 may focus and project an image I1 onto a same location on the retina RN to generate a combined image V1, the pixel structures of the display unit 422 may focus and project an image I2 onto a same location on the retina RN to generate a combined image V2, the pixel structures of the display unit 423 may focus and project an image I3 onto a same location on the retina RN to generate a combined image V3, and the focusing locations of the display units 421, 422, 423 may be different, thus providing the partition and multiplexing display effect.

Figure 5:
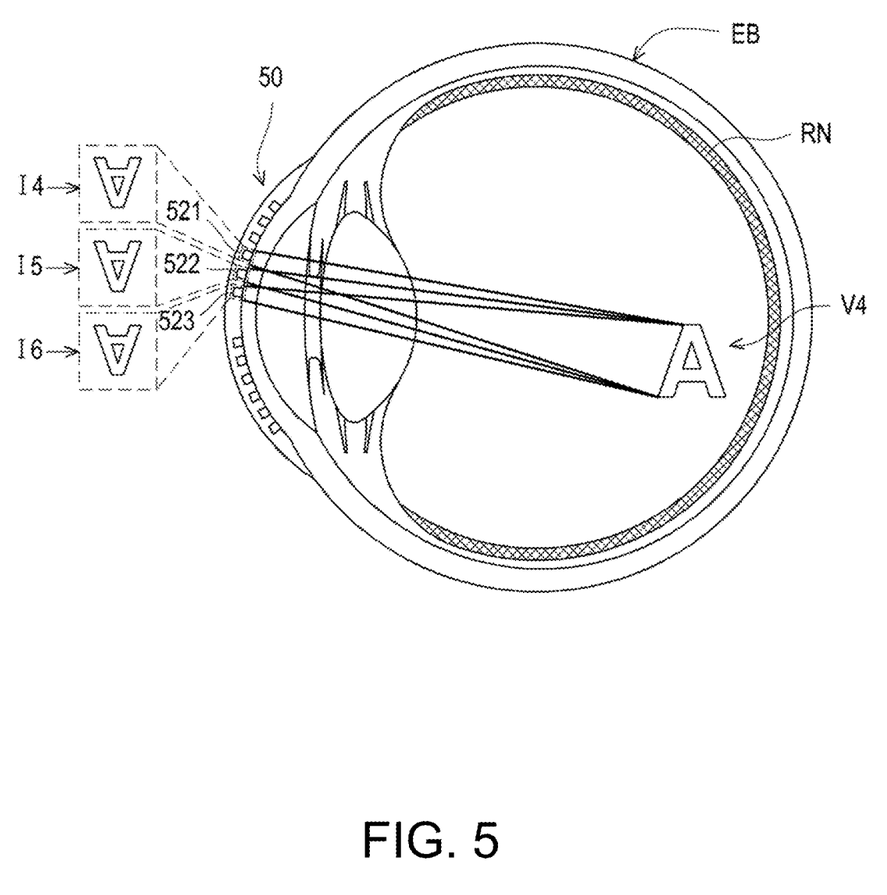
FIG. 5 is a schematic view of a spherical display device 50 according to one embodiment of the present disclosure matching with an eye of a user.

FIG. 5 is a schematic view of a spherical display device 50 according to one embodiment of the present disclosure matching with an eye of a user. Compared to the spherical display device 10 as shown in FIG. 1A to FIG. 1B, the differences of the spherical display device 50 as shown in FIG. 5 exist in that: the spherical display device 50 may include a plurality of display units 521, 522, 523, and the display units 521, 522, 523 may project the images 14, 15, 16 with the same content onto the same location on the retina RN, thus combining the images 14, 15, 16 with lower resolutions to be a mixed image V4 with a higher resolution.

Figure 6:
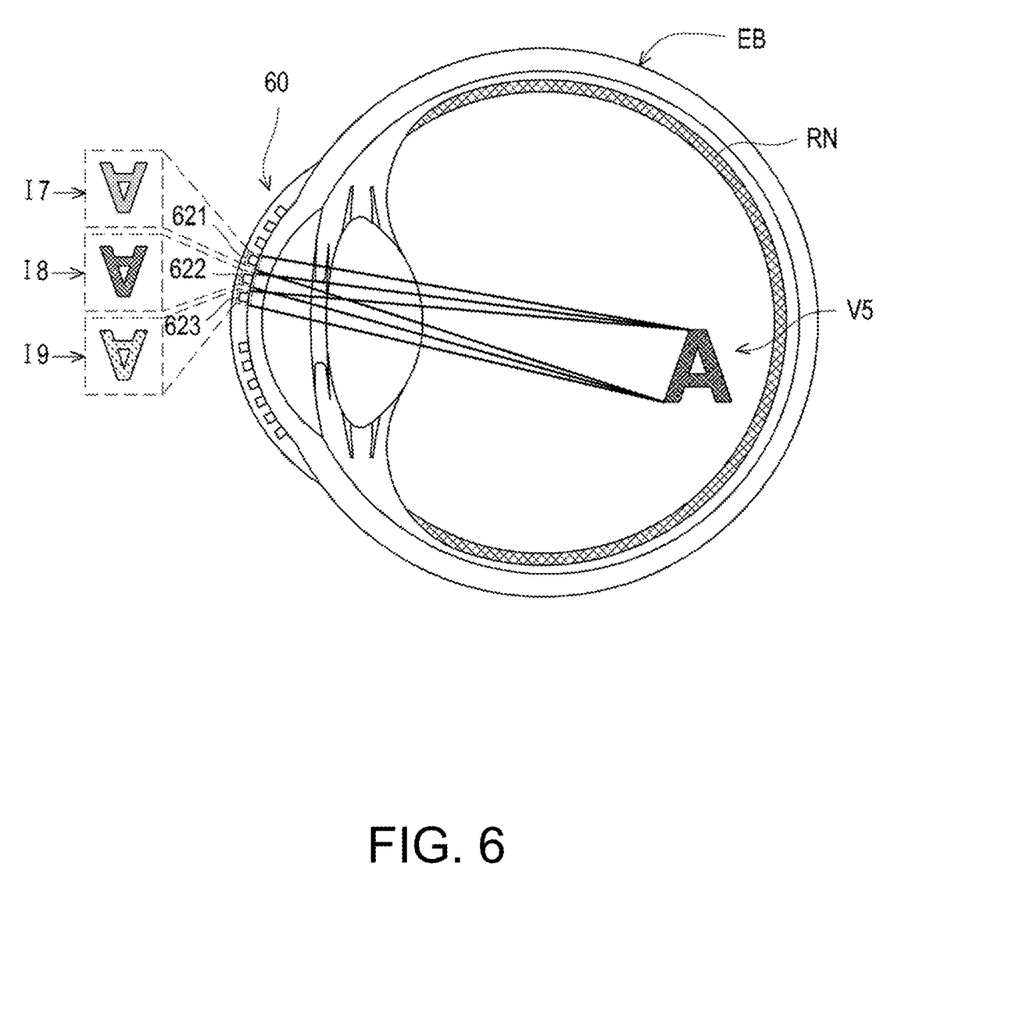
FIG. 6 is a schematic view of a spherical display device 60 according to one embodiment of the present disclosure matching with an eye of a user.

FIG. 6 is a schematic view of a spherical display device 60 according to one embodiment of the present disclosure matching with an eye EB of a user. Compared to the spherical display device 10 as shown in FIG. 1A to FIG. 1B, the differences of the spherical display device 60 as shown in FIG. 6 exist in that: the spherical display device 60 may include a plurality of display units 621, 622, 623, and the display units 521, 522, 523 may provide single-color images I7, I8, I9 with different colors. For example, the image I7 may illustrate a red image, the image I8 may illustrate a green image, and the image I9 may illustrate a blue image. Thus, when the images I7, I8, I9 are projected onto the same location on the retina RN, a color combined image V5 is presented.

Figure 7:
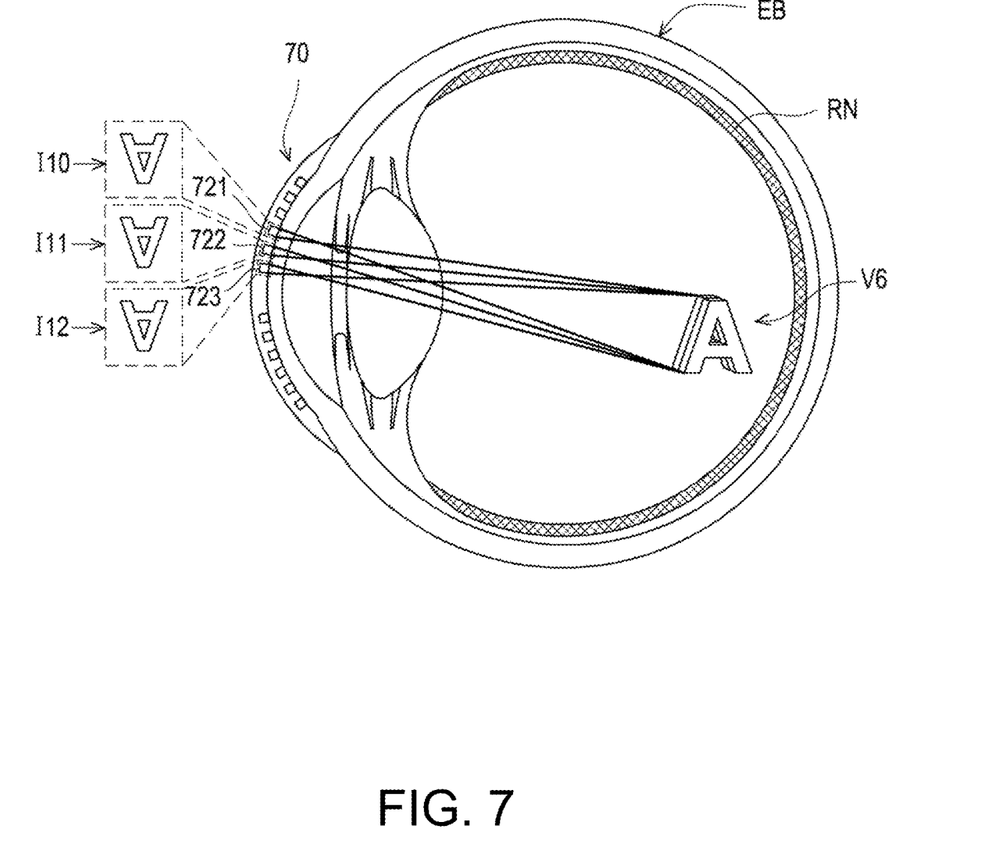
FIG. 7 is a schematic view of a spherical display device 70 according to one embodiment of the present disclosure matching with an eye of a user.

FIG. 7 is a schematic view of a spherical display device 70 according to one embodiment of the present disclosure matching with an eye EB of a user. Compared to the spherical display device 10 as shown in FIG. 1A to FIG. 1B, the differences of the spherical display device 70 as shown in FIG. 7 exist in that: the spherical display device 70 may include a plurality of display units 721, 722, 723, and the images 110, 111, 112 of the display units 721, 722, 723 may be overlaid to generate interference and then be processed, thus forming a hologram image V6 on the retina RN.

In sum, in the spherical display device of the present disclosure, the display units 120 are disposed to have a perpendicular distance D2 to the central axis AX of the arc substrate 110 in the range between 1.345 mm and 4.3 mm (the viewing angle ranges between about 9 to 30 degrees), allowing the main visual area of the eye to be capable of receiving ambient images normally, and by disposing a plurality of through holes in the display units, the air and moisture permeability of the spherical display device may be enhanced.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A spherical display device, comprising:
an arc substrate, having a convex surface and a concave surface opposite to each other;
a plurality of display units, located on the concave surface of the arc substrate; and
at least one light redirecting component, located on the concave surface of the arc substrate, wherein the at least one light redirecting component is separated from any one of the display units and does not overlap with any one of the display units;
wherein a perpendicular distance from the display units to a central axis of the arc substrate ranges between 1.345 mm and 4.3 mm.

2. The spherical display device according to claim 1, wherein the perpendicular distance from the display units to the central axis of the arc substrate ranges between 1.345 mm and 3.29 mm.

3. The spherical display device according to claim 1, wherein in operation, in a direction perpendicular to the spherical display device, some of the display units overlap with a pupil of an eye of a human user.

4. The spherical display device according to claim 1, wherein the spherical display device has a central area and a display area surrounding the central area, the display units are located in the display area and do not exist in the central area, and a viewing angle of the display area is between 9 and 30 degrees.

5. The spherical display device according to claim 1, wherein the arc substrate comprises a plurality of film layers, and the film layers comprise silicon oxide layers and silicon nitride layers alternately stacked.

6. The spherical display device according to claim 1, wherein the display units are physically separated.

7. The spherical display device according to claim 1, wherein the display units comprise a plurality of pixel structures, and through holes are disposed between the pixel structures.

8. The spherical display device according to claim 1, wherein each of the display units comprises a driving circuit layer and a plurality of light emitting components, the driving circuit layer is located between the light emitting components and the arc substrate, and the light emitting components are electrically connected to the driving circuit layer.

9. The spherical display device according to claim 8, wherein each of the display units further comprises a lens layer, and the light emitting components are located between the lens layer and the driving circuit layer.

10. The spherical display device according to claim 9, wherein each of the display units further comprises a polarizing layer, located between the lens layer and the light emitting components.

11. The spherical display device according to claim 1, wherein the at least one light redirecting component is located between the display units, and is configured to redirect and/or reflect the light beams from the display units on the concave surface of the arc substrate toward a retina or a fovea of a human user.

12. The spherical display device according to claim 1, wherein the spherical display device further comprises a photoelectric component, located on the convex surface of the arc substrate.

13. The spherical display device according to claim 12, wherein the photoelectric component comprises a reflective display component, a light detector or a photovoltaic component.

14. The spherical display device according to claim 1, wherein the spherical display device further comprises a protective layer covering the display units, the display units comprise a plurality of pixel structures, and through holes are disposed between the pixel structures, wherein the protective layer covers on the pixel structures of the display units and fills into the through holes disposed between the pixel structures.

15. The spherical display device according to claim 1, wherein the spherical display device comprises an outer cover layer wrapping the arc substrate and the display units.

16. The spherical display device according to claim 15, wherein the outer cover layer comprises an outer layer, and the outer layer comprises a high moisture and high oxygen permeability material.

17. The spherical display device according to claim 16, wherein the outer cover layer further comprises an inner layer, the inner layer is located between the outer layer and the arc substrate, and the inner layer comprises a hard or soft base material.

18. A spherical display device, comprising:
an arc substrate, having a convex surface and a concave surface opposite to each other;
a plurality of display units, located on the concave surface of the arc substrate, wherein the display units are physically separated, and each of the display units has a plurality of through holes;
at least one light redirecting component, located on the concave surface of the arc substrate, wherein the at least one light redirecting component is separated from any one of the display units and does not overlap with any one of the display units; and
an outer cover layer, wrapping the arc substrate and the display units.

19. The spherical display device according to claim 18, wherein a perpendicular distance from the display units to a central axis of the arc substrate ranges between 1.345 mm and 4.3 mm.

20. The spherical display device according to claim 18, wherein a viewing angle of the display units is between 9 and 30 degrees.

* * * * *